US012690491B2

(12) United States Patent
Shin et al.

(10) Patent No.: US 12,690,491 B2
(45) Date of Patent: Jul. 21, 2026

(54) METHOD FOR MANUFACTURING A SEMICONDUCTOR DEVICE

(71) Applicant: SAMSUNG ELECTRONICS CO., LTD., Suwon-si (KR)

(72) Inventors: Yong Chul Shin, Hwaseong-si (KR); MinWoo Rhee, Seoul (KR); Su Min Kim, Hwaseong-si (KR); Il Young Han, Uiwang-si (KR); Nung Pyo Hong, Goyang-si (KR); Seung Don Lee, Seongnam-si (KR); Kyeong Bin Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 781 days.

(21) Appl. No.: 17/975,054

(22) Filed: Oct. 27, 2022

(65) Prior Publication Data

US 2023/0178511 A1 Jun. 8, 2023

(30) Foreign Application Priority Data

Dec. 7, 2021 (KR) ........................ 10-2021-0173904

(51) Int. Cl.
*H10W 90/00* (2026.01)
*H10W 72/00* (2026.01)
(Continued)

(52) U.S. Cl.
CPC .......... *H10W 90/00* (2026.01); *H10W 72/011* (2026.01); *H10W 72/01* (2026.01);
(Continued)

(58) Field of Classification Search
CPC ....................................................... H01L 24/80
See application file for complete search history.

(56) References Cited

U.S. PATENT DOCUMENTS 4,278,867 A * 7/1981 Tan ........................ B23K 26/12
219/121.64
6,762,072 B2 7/2004 Lutz
(Continued)

FOREIGN PATENT DOCUMENTS

KR 10-2009-0018006 A 2/2009
KR 10-2014-0005743 A 1/2014
(Continued)

OTHER PUBLICATIONS

Communication issued Jul. 7, 2025 by the Korean Intellectual Property Office in Korean Patent Application No. 10-2021-0173904.
(Continued)

*Primary Examiner* — William A Harriston
(74) *Attorney, Agent, or Firm* — Sughrue Mion, PLLC

(57) ABSTRACT

A method for manufacturing a semiconductor device is provided. The method for manufacturing a semiconductor device which uses an apparatus for manufacturing the semiconductor device including: a chamber, a support structure provided inside the chamber, and configured to support a bonding structure that comprises a first substrate structure, a second substrate structure, and a bonding metal layer provided between the first substrate structure and the second substrate structure, and a laser device which is provided above the chamber, the semiconductor device manufacturing method comprising: irradiating a laser beam to the bonding structure using the laser device.

18 Claims, 13 Drawing Sheets

(51) Int. Cl.

| | | |
|---|---|---|
| *H10W 72/90* | (2026.01) | |
| *H10W 74/15* | (2026.01) | |
| *H10W 80/00* | (2026.01) | |
| *H10W 90/20* | (2026.01) | |

(52) U.S. Cl.
CPC ........ *H10W 72/921* (2026.01); *H10W 72/923* (2026.01); *H10W 72/934* (2026.01); *H10W 72/952* (2026.01); *H10W 72/953* (2026.01); *H10W 74/15* (2026.01); *H10W 80/102* (2026.01); *H10W 80/312* (2026.01); *H10W 80/327* (2026.01); *H10W 80/338* (2026.01); *H10W 90/297* (2026.01); *H10W 90/722* (2026.01); *H10W 90/724* (2026.01); *H10W 90/732* (2026.01); *H10W 90/734* (2026.01); *H10W 90/792* (2026.01)

(56) References Cited

U.S. PATENT DOCUMENTS

| | | | |
|---|---|---|---|
| 7,718,554 B2 | 5/2010 | Yoo et al. | |
| 7,923,660 B2 * | 4/2011 | Lerner | ................ H10P 72/0434 |
| | | | 219/121.85 |

| | | | |
|---|---|---|---|
| 9,711,555 B2 | 7/2017 | Liu et al. | |
| 9,728,521 B2 | 8/2017 | Tsai et al. | |
| 10,354,972 B2 * | 7/2019 | Liu | ...................... H10W 72/013 |
| 2003/0170966 A1 * | 9/2003 | Lutz | ................... B81C 1/00269 |
| | | | 438/456 |
| 2017/0330855 A1 * | 11/2017 | Tung | ................. H10W 72/0198 |
| 2019/0051628 A1 * | 2/2019 | Liu | ..................... H10W 72/013 |
| 2020/0006145 A1 * | 1/2020 | Li | ......................... H10D 84/038 |
| 2020/0203224 A1 | 6/2020 | Hiblot et al. | |
| 2023/0138575 A1 * | 5/2023 | Zhang | ................. B23K 26/082 |
| | | | 438/795 |

FOREIGN PATENT DOCUMENTS

| | | |
|---|---|---|
| KR | 10-2020-0078752 | 7/2020 |
| KR | 10-2020-0080483 A | 7/2020 |

OTHER PUBLICATIONS

Communication issued Dec. 30, 2025 by the Korean Ministry of Intellectual Property for KR Patent Application No. 10-2021-0173904.

* cited by examiner

METHOD FOR MANUFACTURING A SEMICONDUCTOR DEVICE

CROSS-REFERENCE TO RELATED APPLICATION

This application claims priority from Korean Patent Application No. 10-2021-0173904, filed on Dec. 7, 2021, in the Korean Intellectual Property Office, the disclosure of which is incorporated by reference herein in its entirety.

BACKGROUND

1. Field

The present disclosure relates to a method for manufacturing the semiconductor device.

2. Description of Related Art

There is an ongoing need for a semiconductor device with increased data processing capacity and reduced volume. One way to increase integration of the semiconductor device is to bond wafers to each other or to bond a wafer and a die.

To bond wafers or a wafer and a die, a method is needed which avoids undesired characteristic deterioration caused by heating an entire wafer.

SUMMARY

One or more example embodiments provide an apparatus for manufacturing a semiconductor device capable of preventing characteristic deterioration of the semiconductor device in the process of bonding the wafers or bonding the die and the wafer.

One or more example embodiments also provide a method for manufacturing a semiconductor device capable of preventing characteristic deterioration of the semiconductor device in the process of bonding the wafers or bonding the die and the wafer.

One or more example embodiments further provide a semiconductor device capable of preventing characteristic deterioration in the process of bonding the wafers or bonding the die and the wafer.

According to an aspect of an example embodiment, a method for manufacturing a semiconductor device which uses an apparatus for manufacturing the semiconductor device including: a chamber, a support structure provided inside the chamber, and configured to support a bonding structure that comprises a first substrate structure, a second substrate structure, and a bonding metal layer provided between the first substrate structure and the second substrate structure, and a laser device which is provided above the chamber, the semiconductor device manufacturing method comprising: irradiating a laser beam to the bonding structure using the laser device.

According to an aspect of an example embodiment, a method for manufacturing a semiconductor device includes providing a bonding structure on a support structure, wherein the bonding structure includes a first substrate structure, a second substrate structure, and a bonding metal layer between the first substrate structure and the second substrate structure; and irradiating a laser beam to the bonding structure.

According to an aspect of an example embodiment, a method for manufacturing a semiconductor device, includes: forming a first bonding insulation layer on a first substrate structure; removing a part of the first bonding insulation layer to form a first trench; forming a first adhesive layer along a bottom surface and side walls of the first trench; forming a first metal layer on the first adhesive layer to form a first bonding metal layer, the first metal layer including a metal material different from the first adhesive layer; forming a second bonding insulation layer on a second substrate structure; removing a part of the second bonding insulation layer to form a second trench; forming a second adhesive layer along a bottom surface and side walls of the second trench; forming a second metal layer on the second adhesive layer to form a second bonding metal layer, the second metal layer including a metal material different from the second adhesive layer; providing the second substrate structure on the first substrate structure; and irradiating a laser beam to the first substrate structure and the second substrate structure to bond the first metal layer with the second metal layer.

According to an aspect of an example embodiment, a semiconductor device includes: a first substrate structure; a second substrate structure provided on the first substrate structure; and a bonding layer provided between the first substrate structure and the second substrate structure. The bonding layer includes a metal layer, and an adhesive layer having an absorptivity of a laser beam in a first wavelength band that is higher than the metal layer.

BRIEF DESCRIPTION OF THE DRAWINGS

The above and other aspects and features will be more apparent from the following description of example embodiments with reference to the attached drawings, in which:

FIGS. 2 and 3 are diagrams schematically showing a process in which the apparatus for manufacturing the semiconductor device according to some example embodiments irradiates the semiconductor device with a laser;

FIG. 8 is a diagram which shows the semiconductor device manufactured by the apparatus for manufacturing the semiconductor device according to some example embodiments;

DETAILED DESCRIPTION

Figure 1:
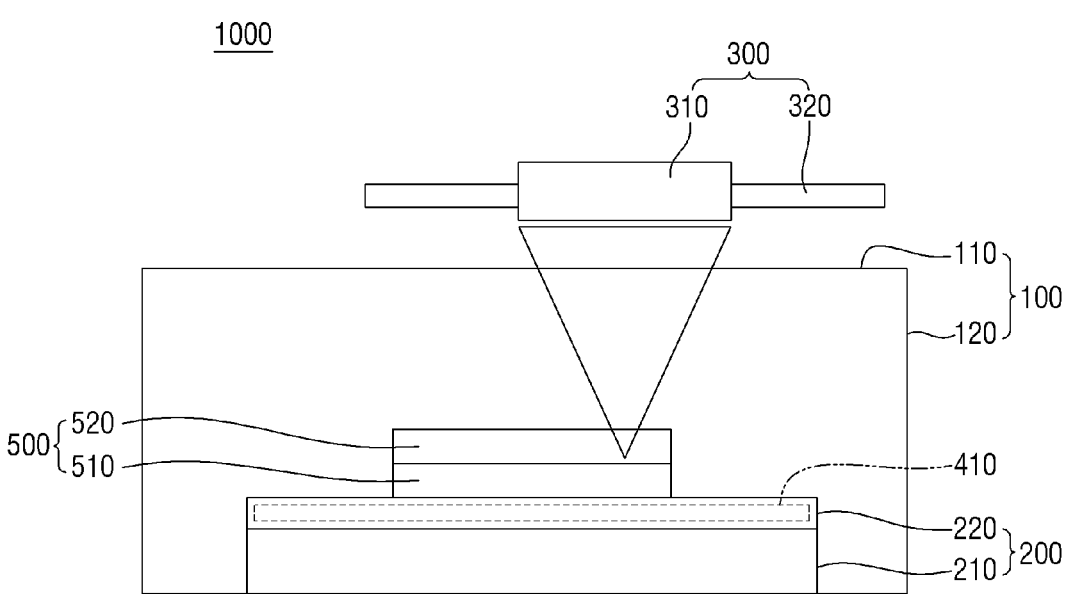
FIG. 1 is a diagram schematically showing an apparatus for manufacturing a semiconductor device according to some example embodiments.

Hereinafter, an apparatus for manufacturing a semiconductor device according to some example embodiments will be described referring to FIGS. 1 to 5.

Hereinafter, example embodiments will be described in detail with reference to the accompanying drawings. Like components are denoted by like reference numerals throughout the specification, and repeated descriptions thereof are omitted. Each example embodiment is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
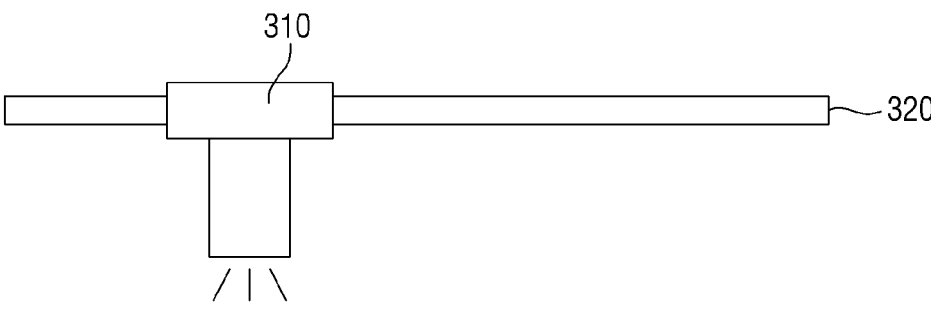
Figure 2:
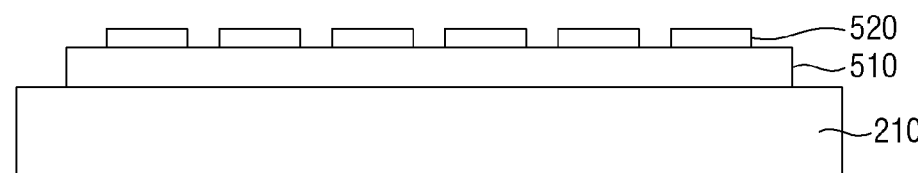
Figure 2:
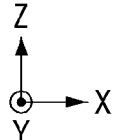
Figure 3:
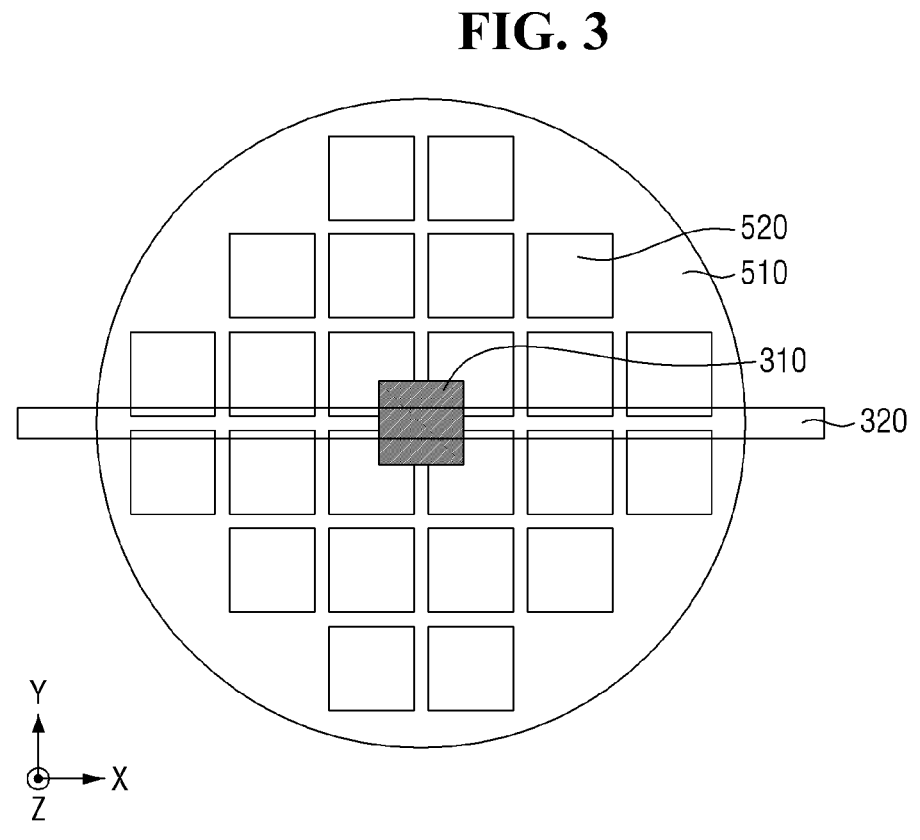
Figure 4:
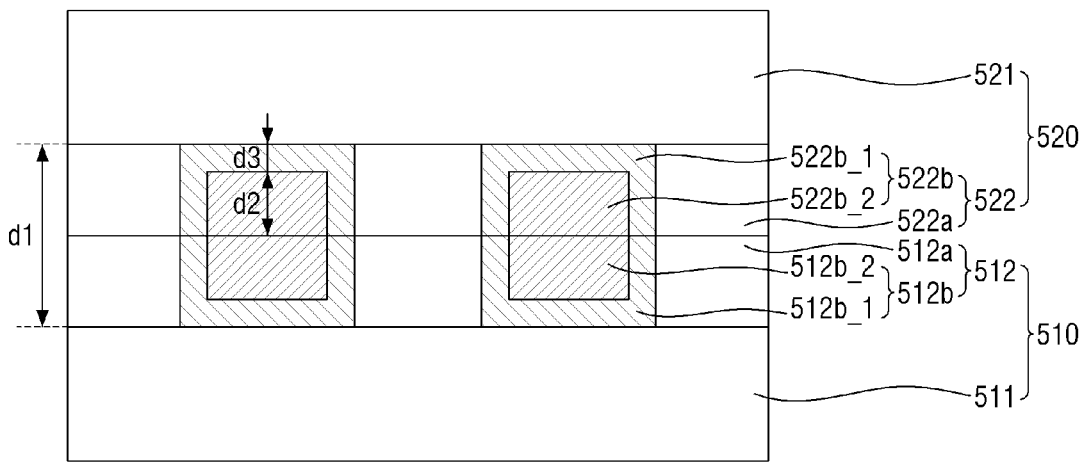
FIG. 4 is a diagram which schematically shows a bonding structure of the semiconductor device manufactured by the apparatus for manufacturing the semiconductor device according to some example embodiments.
Figure 5:
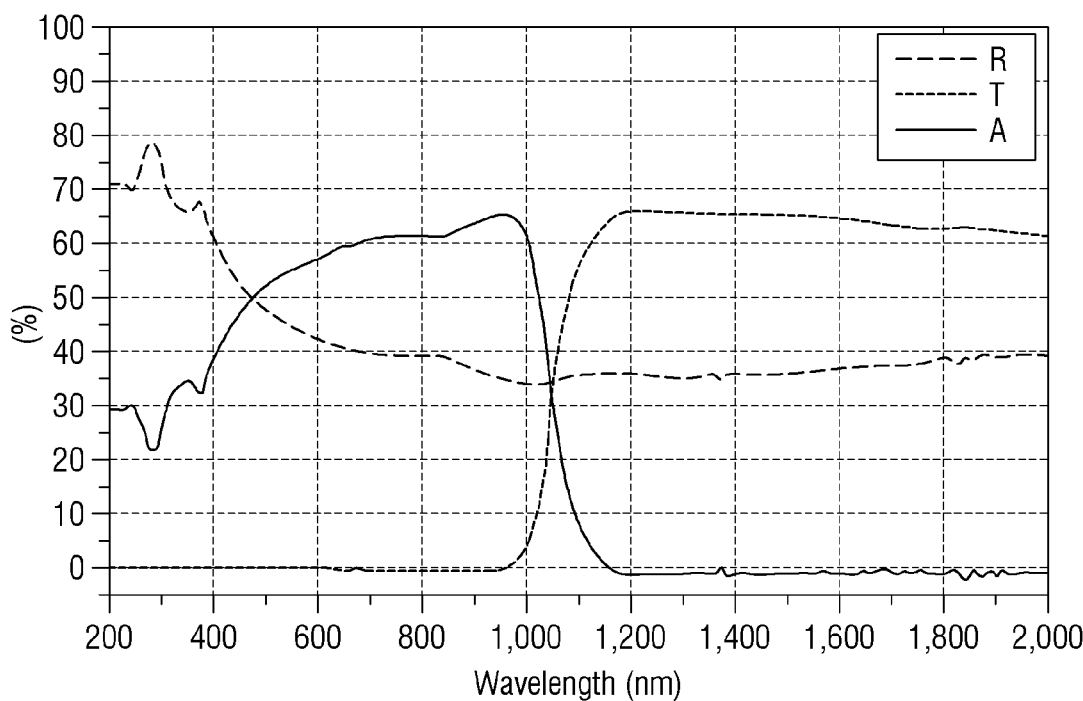
FIG. 5 is a diagram for explaining a wavelength band of the laser used by the apparatus for manufacturing the semiconductor device according to some example embodiments.

FIG. 1 is a diagram schematically showing an apparatus for manufacturing a semiconductor device according to some example embodiments. FIGS. 2 and 3 are diagrams schematically showing a process in which the apparatus for manufacturing the semiconductor device according to some example embodiments irradiates the semiconductor device with a laser. FIG. 4 is a diagram which schematically shows a bonding structure of the semiconductor device manufactured by the apparatus for manufacturing the semiconductor device according to some example embodiments. FIG. 5 is a diagram for explaining a wavelength band of the laser used by the apparatus for manufacturing the semiconductor device according to some example embodiments.

Referring to FIG. 1, an apparatus 1000 for manufacturing the semiconductor device according to some example embodiments may include a chamber 100, a support unit 200 (i.e., a support), a laser unit 300 (i.e., a laser), and a cooling unit (i.e., a heat exchanger) including a cooling plate 410. The apparatus 1000 may include one or more memories storing instructions and one or more processors that are configured to operate according to the instructions to control operation of the apparatus 1000.

The chamber 100 provides an internal space for performing a manufacturing process of the semiconductor device. The manufacturing process of the semiconductor device may include, for example, a process of bonding a wafer to a wafer, a process of bonding a die and a wafer, and the like to manufacture the semiconductor device. However, example embodiments are not limited thereto.

The chamber 100 may include an upper wall 110 and a side wall 120, and may be provided below a laser unit 300, which will be described below. For example, the upper wall 110 of the chamber 100 may include a transparent material so that the laser beam may be transmitted through the upper wall 110. However, example embodiments are not limited thereto.

The support unit 200 may be provided inside the chamber 100 and may support a bonding structure 500 to be described later. The support unit 200 may include a stage 210 that supports the bonding structure 500. The stage 210 may serve to secure the die or the wafer after they are aligned.

The support unit 200 may include a chuck 220 therein. The chuck 220 may be, for example, an electrostatic chuck for maintaining the bonding structure 500 with an electrostatic adsorption force. However, example embodiments are not limited thereto.

The laser unit 300 may be provided above the chamber 100 and may heat the bonding structure 500. The laser unit 300 may include a laser beam source 310 that irradiates the bonding structure 500 with a laser beam, and a moving unit 320 (i.e., moving assembly) that moves the laser beam source 310. The moving unit 320 (i.e., moving assembly) may include one or more motors, gears, arms, belts, conveyors, move the laser beam source 310. For example, the moving unit 320 may be controlled by the one or more processors of the apparatus 1000.

In some example embodiments, a first bonding structure 510 and a second bonding structure 520 may be provided on the stage 210 to be spaced apart from each other along a first direction X and/or a second direction Y. For example, bonding of the first bonding structure 510 and the second bonding structure 520 may include bonding of a die onto the wafer or bonding of the wafer onto the wafer. However, example embodiments are not limited thereto.

Referring to FIG. 2, the laser beam source 310 may move in a third direction Z. That is, the moving unit 320 may move the laser beam source 310 in a vertical direction to irradiate the first bonding structure 510 and the second bonding structure 520 with a laser.

Referring to FIG. 3, the moving unit 320 may move the laser beam source 310 may move in the first direction X and/or the second direction Y on an X-Y plane. That is, the moving unit 320 may move the laser beam source 310 horizontally to irradiate the first bonding structure 510 and the second bonding structure 520 with a laser.

Referring to FIG. 4, the bonding structure 500 may include a first substrate structure 510, and a second substrate structure 520 on the first substrate structure 510.

Specifically, the first bonding structure 510 may include the first substrate structure 511 and a first bonding layer 512. The second bonding structure 520 may include the second substrate structure 521 and a second bonding layer 522. The second bonding layer 522 may be provided on the first bonding layer 512.

As described below, semiconductor devices 2000A and 2000B may include the first and second substrate structures 510 and 520. The first and second substrate structures 511 and 521 may include one of a silicon (Si) substrate, a silicon germanium (SiGe) substrate, a germanium (Ge) substrate, SGOI (silicon germanium on insulator), SOI (silicon-on-insulator), and GOI (Germanium-On-Insulator). However, example embodiments are not limited thereto.

The first bonding layer 512 may include a first bonding insulation layer 512a and a first bonding metal layer 512b. The first bonding metal layer 512b may include a first metal layer 512b_2 and a first adhesive layer 512b_1. The second bonding layer 522 may include a second bonding insulation layer 522a and a second bonding metal layer 522b. The second bonding metal layer 522b may include a second metal layer 522b_2 and a second adhesive layer 522b_1.

The first and second metal layers 512b_2 and 522b_2 may bond the first and second substrate structures 511 and 521 to each other. The first and second metal layers 512b_2 and 522b_2 may include copper (Cu). In this case, the first and second metal layers 512b_2 and 522b_2 may be heated by the laser beam irradiated by the laser unit 300 to form a Cu—Cu bond.

Specifically, the first and second metal layers 512b_2 and 522b_2 may be heated with a laser beam to form a Cu—Cu bond by diffusion of Cu and growth of grains. In this case, no interface may be formed between the first and second metal layers $512b\_2$ and $522b\_2$. However, example embodiments are not limited thereto.

On the other hand, the bond between the first and second substrate structures 511 and 521 according to some example embodiments may be a hybrid bond in which different types of materials are bonded. For example, the materials of the first and second bonding insulation layers 512a and 522a may be different from the materials of the first and second metal layers $512b\_2$ and $522b\_2$.

As described above, the first and second metal layers $512b\_2$ and $522b\_2$ may include copper (Cu), and the first and second bonding insulation layers 512a and 522a may include a dielectric material. For example, the first and second bonding insulation layers 512a and 522a may include silicon oxide ($SiO_2$) or silicon carbonitride (SiCN). However, example embodiments are not limited thereto.

Each of the first and second adhesive layers $512b\_1$ and $522b\_1$ may be provided adjacent to the first and second metal layers $512b\_2$ and $522b\_2$. Further, the materials of the first and second adhesive layers $512b\_1$ and $522b\_1$ may be different from the materials of the first and second metal layers $512b\_2$ and $522b\_2$.

The first and second adhesive layers $512b\_1$ and $522b\_1$ may have an absorptivity, with respect to the laser beam, in a specific wavelength band higher than the first and second metal layers $512b\_2$ and $522b\_2$ have in the specific wavelength band. Thus, the first and second adhesive layers $512b\_1$ and $522b\_1$ may be formed to promote the diffusion of Cu and grain growth of the first and second metal layers $512b\_2$ and $522b\_2$, whose laser absorption is lower than the first and second adhesive layers $512b\_1$ and $522b\_1$. In this regard, due to the higher absorptivity, the first and second adhesive layers $512b\_1$ and $522b\_1$ generate more heat than the first and second metal layers $512b\_2$ and $522b\_2$ when radiated with the laser beam. The heat generated by the first and second adhesive layers $512b\_1$ and $522b\_1$ may be transferred to the first and second metal layers $512b\_2$ and $522b\_2$. Thus, the heat transfer to the first and second metal layers $512b\_2$ and $522b\_2$ may be enhanced through the first and second adhesive layers $512b\_1$ and $522b\_1$ to effectively form a Cu—Cu bond.

Referring to FIG. 5, a reflectivity R, a transmissivity T, and absorptivity A of the laser to silicon (Si) for each wavelength may be known. The laser unit 300 according to some example embodiments may use a laser having a wavelength in the range of 1,000 to 1,100 nm to transmit through silicon (Si).

Materials having a high absorptivity in a wavelength band in the range of 1,000 to 1,100 nm may be used as the first and second adhesive layers $512b\_1$ and $522b\_1$. For example, the first and second adhesive layers $512b\_1$ and $522b\_1$ may include at least one of titanium (Ti), titanium nitride (TiN), tantalum, tantalum nitride (TaN), vanadium (V) or molybdenum (Mo). However, example embodiments are not limited thereto.

For example, when the wavelength band of the laser exceeds 1,100 nm, the absorptivity of titanium (Ti), vanadium (V), and molybdenum (Mo) may be significantly degraded. Therefore, in an apparatus for manufacturing the semiconductor device according to some example embodiments, laser having wavelengths in the range of 1,000 to 1,100 nm may be used to be effectively absorbed by titanium (Ti), vanadium (V), molybdenum (Mo), or the like, while transmitting through silicon (Si).

That is, the laser beam may be absorbed by the first and second adhesive layers $512b\_1$ and $522b\_1$ and the first and second metal layers $512b\_2$ and $522b\_2$, while transmitting through the first and second substrate structures 511 and 521. Therefore, the laser beam may directly reach the first and second metal layers $512b\_2$ and $522b\_2$.

As shown in FIG. 4, a height of each of the first and second bonding layers 512 and 522 may correspond to d1, a height of each of the first and second metal layers $512b\_2$ and $522b\_2$ may correspond to d2, and a height of each of the first and second adhesive layers $512b\_1$ and $522b\_1$ may correspond to d3. For example, d1 may be about 10 to 20 µm. A depth of focus (DOF) of the laser beam used in the laser unit 300 according to some example embodiments may also corresponding to d1, and in this regard may be about 10 to 20 µm. However, example embodiments are not limited thereto. The DOF according to some example embodiments may be correspond to the first and second adhesive layers $512b\_1$ and $522b\_1$, and the first and second metal layers $512b\_2$ and $522b\_2$, which are the layers by which the laser beam is absorbed, or may be formed in a wider range in the vertical direction Z or the horizontal direction (X or Y) than the layer by which the laser beam is absorbed. As a result, a sufficient amount of energy may reach the layer by which the laser beam is absorbed.

Further, the DOF may be appropriately adjusted in consideration of a gap between the first and second metal layers $512b\_2$ and $522b\_2$ and the first and second adhesive layers $512b\_1$ and $522b\_1$, thicknesses of the first and second metal layers $512b\_2$ and $522b\_2$, and thicknesses of the first and second adhesive layers $512b\_1$ and $522b\_1$. Further, the thicknesses of each of the first and second adhesive layers $512b\_1$ and $522b\_1$ may be appropriately adjusted in consideration of the volumes of the first and second metal layers $512b\_2$ and $522b\_2$ for electrical conduction.

For example, a thickness d2 of each of the first and second metal layers $512b\_2$ and $522b\_2$ may be about 10 µm, and a thickness d3 of each of the first and second adhesive layers $512b\_1$ and $522b\_1$ may be about 0.1 to 0.3 µm. In this regard, a DOF of the laser beam may also correspond to d2 or d3, and in this regard may be about 10 µm, or about 0.1 to 0.3 µm However, example embodiments are not limited thereto.

The cooling unit may transfer the heat generated by the laser beam. When the cooling unit is the cooling plate 410, it may be provided on the chuck 220 inside the support unit 200. In this case, the cooling plate 410 may cool the substrate structure 511 and 521 other than the adhesive layer, using cooling water. However, example embodiments are not limited thereto, and as long as a cooling atmosphere is formed inside the substrate structures 511 and 521 or the chamber 100, the structure of the cooling unit may be variously configured.

Figure 6:
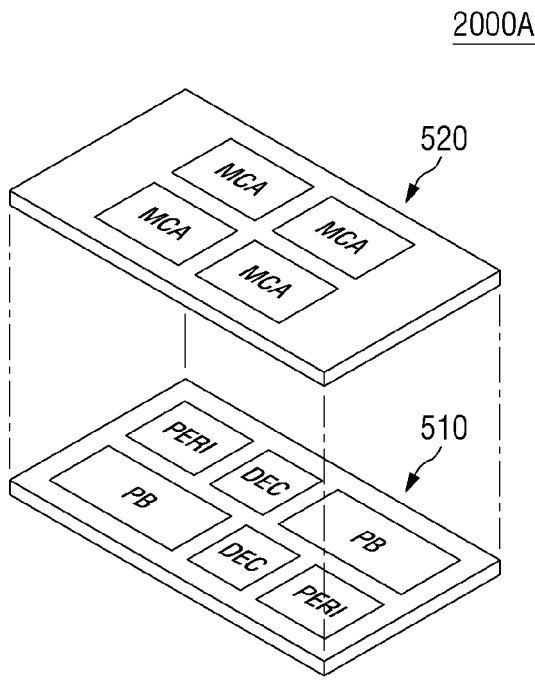
FIG. 6 is a schematic layout diagram of the semiconductor device manufactured by the apparatus for manufacturing the semiconductor device according to some example embodiments.
Figure 7:
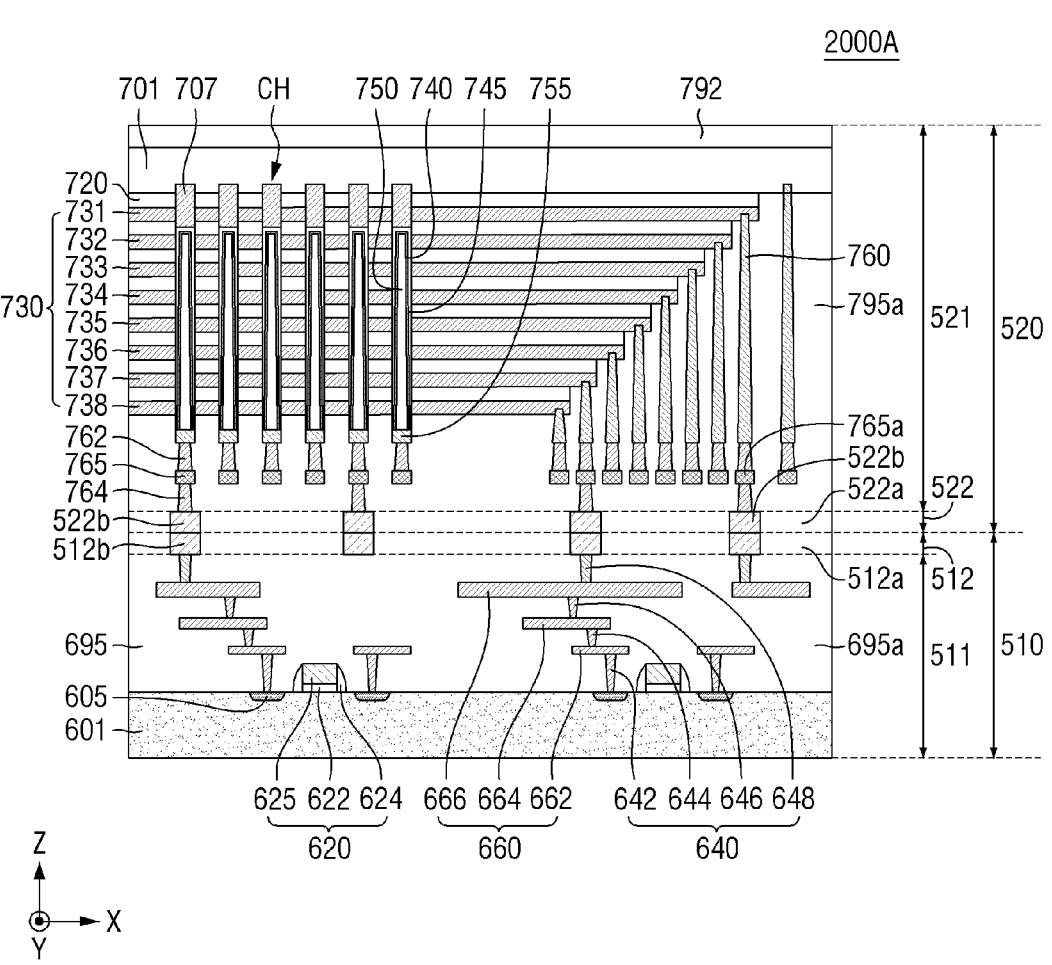
FIG. 7 is a diagram which shows the semiconductor device manufactured by the apparatus for manufacturing the semiconductor device according to some example embodiments.

FIG. 6 is a schematic layout diagram of the semiconductor device manufactured by the apparatus for manufacturing the semiconductor device according to some example embodiments. FIG. 7 is a diagram which shows the semiconductor device manufactured by the apparatus for manufacturing the semiconductor device according to some example embodiments. For convenience of explanation, repeated parts of the contents described using FIGS. 1 to 5 will not be described or briefly described.

Referring to FIG. 6, a semiconductor device 2000A according to some example embodiments may include a first bonding structure 510 and a second bonding structure 520. The first bonding structure 510 and the second bonding structure 520 may be bonded and coupled to each other.

The first bonding structure 510 may include peripheral circuits, and the second bonding structure 520 may include a memory cell array region MCA. A plurality of memory cell array regions MCA may be provided in the second bonding structure 520. For example, the first bonding structure 510 may include a logic chip structure, and the second bonding structure 520 may include a memory chip structure. However, example embodiments are not limited thereto.

The peripheral circuits may include a row decoder DEC, a page buffer PB, and other circuit PERI, each of which may include a latch circuit, a cache circuit, a sense amplifier, an input/output buffer, an ESD (Electrostatic discharge) element, or a data input/output circuit. The row decoder DEC, the page buffer PB, and other circuit PERI in the peripheral circuit may be provided in various forms.

Referring to FIG. 7, the semiconductor device 2000A may include a first bonding structure 510 and a second bonding structure 520 bonded to each other. The first bonding structure 510 includes a first substrate structure 511 and a first bonding layer 512, and the second bonding structure 520 may include a second substrate structure 521 and a second bonding layer 522.

The first substrate structure 511 may include a first substrate 601, circuit elements 620, circuit contact plugs 640, and circuit wiring lines 660 provided on the first substrate 601.

The first substrate 601 may have an upper side extending along the first direction X and the second direction Y. Separate element separation layers may be formed on the first substrate 601 to define an active region. Source/drain regions 605 including impurities may be provided in a part of the active region. The first substrate 601 may include a semiconductor material, for example, a group IV semiconductor, a group III-V compound semiconductor or a group II-VII compound semiconductor. For example, the first substrate 601 may be provided as a bulk wafer of a single crystal.

The circuit elements 620 may include a transistor. Each circuit element 620 may include a circuit gate dielectric layer 622, a spacer layer 624, and a circuit gate electrode 625. Source/drain regions 605 may be provided inside the first substrate 601 on both sides of the circuit gate electrode 625.

A peripheral region insulating layer 695a may be provided on the circuit element 620 on the first substrate 601, and may be a layer that is continuous with first insulating layer 695 of the first bonding layer 512. The circuit contact plugs 640 may penetrate the peripheral region insulating layer 695a and be connected to the source/drain regions 605, and may include first to fourth circuit contact plugs 642, 644, 646, and 648 located sequentially from the first substrate 601. An electric signal may be applied to the circuit element 620 by the circuit contact plug 640.

Additionally, circuit contact plugs 640 may also be connected to the circuit gate electrode 625. The circuit wiring lines 660 may be connected to the circuit contact plugs 640, and may include first to third circuit wiring lines 662, 664, and 666 that form a plurality of layers. The first metal layer 512b of the first metal layer 512 may be electrically connected to the circuit contact plugs 640.

The first bonding metal layer 512b may include a first metal layer 512b_2 and a first adhesive layer 512b_1. According to some example embodiments, the content relating to the first bonding structure 510 described referring to FIGS. 1 to 5 may be similarly applied to FIGS. 6 and 7.

The second substrate structure 521 may include a second substrate 701, a plurality of gate electrodes 730 stacked on a lower side of the second substrate 701, interlayer insulating layers 720 stacked alternately with the gate electrodes 730, channels CH penetrating the gate electrodes 730, a cell region insulating layer 795a that covers the gate electrodes 730, and a pad insulating layer 792 stacked on the upper side of the second substrate 701 on the cell region insulating layer 795a. The cell region insulating layer 795a may be a layer that is continuous with second insulating layer 795 of the second bonding structure 520. In some example embodiments, the second substrate structure 521 may include NAND memory cells, but example embodiments are not limited thereto. In some example embodiments, the second substrate structure 521 may include volatile memory such as a dynamic random access memory (DRAM) and a static random access memory (SRAM), as well as various non-volatile memory elements.

The second substrate structure 521 may further include channel regions 740 in the channels CH, gate dielectric layers 745, channel insulation layers 750, and channel pads 755. The second substrate structure 521 may further includes, as wiring structures, cell contact plugs 760, first conductive plugs 762, bit lines 765 and 765a, and second conductive plugs 764 that apply the signal to the gate electrodes 730 and the second substrate 701.

The second substrate 701 may have a lower side extending along the first direction X and the second direction Y. The second substrate 701 may include a semiconductor material, for example, a group IV semiconductor, a group III-V compound semiconductor or a group II-VI compound semiconductor. For example, the group IV semiconductor may include silicon, germanium or silicon-germanium. For example, the second substrate 701 may be provided as a polycrystalline layer or an epitaxial layer. The second substrate 701 may include a doping region including impurities.

The gate electrodes 730 may be stacked on the lower side of the second substrate 701 to be vertically spaced apart from each other, and may form a stacked structure together with the interlayer insulating layers 720. The gate electrodes 730 may include a lower gate electrode 731, memory gate electrodes 732 to 736 forming a plurality of memory cells MC, and upper gate electrodes 737 and 738. The number of memory gate electrodes 732 to 736 forming the memory cell MC may be determined depending on the capacity of the semiconductor device 2000A. For example, one or more upper and lower gate electrodes 731, 737 and 738 may each be provided, and may have a structure that is the same as or different from the gate electrodes 730 of the memory cell MC. Some gate electrodes 730, for example, the memory gate electrodes 732 and 736 adjacent to upper or lower gate electrodes 731, 737, and 738 may be dummy gate electrodes. However, example embodiments are not limited thereto.

The gate electrodes 730 may be stacked on the lower side of the second substrate 701 to be vertically spaced apart from each other, and may extend in at least one direction at different lengths to form a stepped step. The gate electrodes 730 may also form a step in the first direction X and the second direction Y. In the gate electrodes 730, a predetermined region including the ends of the gate electrodes 730 may be exposed by the step. The gate electrodes 730 may be connected to the cell contact plugs 760 in that region.

Additionally, the gate electrodes 730 may be separated by a separation region along the second direction Y. The gate electrode 730 may form one memory block between the pair of separation regions, but example embodiments are not limited thereto. Some of the gate electrodes 730, for example, the memory gate electrodes 732 to 736 may form one layer inside one memory block.

The interlayer insulating layers 720 may be provided between the gate electrodes 730. In a manner similar to the gate electrodes 730, the interlayer insulating layers 720 may also be spaced apart from each other along a direction perpendicular to the lower side of the second substrate 701 and extend in the first direction X. The interlayer insulating layers 720 may include an insulating material such as silicon oxide or silicon nitride.

The channels CH may be spaced apart from each other, while forming rows and columns on the lower side of the second substrate 701. The channels CH may form a grid pattern, or be provided in a zigzag form in one direction. The channels CH have a columnar shape, and may have an inclined side surface that becomes narrower toward the second substrate 701 depending on the aspect ratio. For example, some of the channels CH may be dummy channels, and the dummy channels may be further provided outside the channels CH.

The channel region 740 may be provided in the channel CH. For example, the channel region 740 in the channel CH may be formed in an annular shape that surrounds the internal channel insulating layer 750, but may also have a columnar shape such as a cylinder or a prism without the channel insulating layer 750. The channel region 740 may be connected to the epitaxial layer 707 at the top. The channel region 740 may include a semiconductor material such as polycrystalline silicon or single crystal silicon, and the semiconductor material may be an undoped material or a material including p-type or n-type impurities.

The channel pads 755 may be provided above the channel region 740 in the channels CH. The channel pads 755 may cover the upper side of the channel insulating layer 750 and may be electrically connected to the channel region 740. The channel pads 755 may include, for example, doped polycrystalline silicon.

The gate dielectric layer 745 may be provided between the gate electrodes 730 and the channel region 740. Additionally, the gate dielectric layer 745 may include a tunneling layer, a charge storage layer, and a blocking layer that are sequentially stacked from the channel region 740. The tunneling layer may tunnel charges to the charge storage layer, and may include, for example, silicon oxide ($SiO_2$), silicon nitride ($Si_3N_4$), silicon oxynitride (SiON) or a combination thereof. The charge storage layer may be a charge trap layer or a floating gate conductive layer. The blocking layer may include silicon oxide ($SiO_2$), silicon nitride ($Si_3N_4$), silicon oxynitride (SiON), high dielectric constant (high-k) dielectric materials or a combination thereof. For example, at least a part of the gate dielectric layer 745 may extend horizontally along the gate electrode 730.

The epitaxial layer 707 may be provided on the lower side of the second substrate 701 at the upper ends of the channels CH, and may be provided on the side surface of at least one gate electrode 730. The epitaxial layer 707 may be provided in a recessed region of the second substrate 701. The level of the lower surface of the epitaxial layer 707 may be lower than the lower surface of the uppermost gate electrode 731 and higher than the upper surface of the gate electrode 732 below it, but example embodiments are not limited to the shown example. For example, the epitaxial layer 707 may be omitted, and in this case, the channel region 740 may be directly connected to the second substrate 701 or may be connected to a separate conductive layer on the second substrate 701.

The second substrate structure 521 may further include cell contact plugs 760, first conductive plugs 762, bit lines 765 and 765a, and second conductive plugs 764 which are wiring structures providing electrical connections to the first substrate structure 511. Such wiring structures may include conductive materials. The wiring structures may include, for example, tungsten (W), aluminum (Al), copper (Cu), tungsten nitride (WN), tantalum nitride (TaN), titanium nitride (TiN) or a combination thereof.

The cell contact plugs 760 may be provided on the second substrate 701, and may penetrate the cell region insulating layers 795a and be connected to the gate electrodes 730 and the second substrate 701. The cell contact plugs 760 may be connected to the first conductive plugs 762 at the lower end. The cell contact plugs 760 may have a cylindrical shape. For example, the cell contact plugs 760 may have an inclined side surface that becomes narrower toward the second substrate 701 depending on the aspect ratio. For example, some of the cell contact plugs 760 may be dummy contact plugs to which no electrical signal is applied. However, example embodiments are not limited thereto.

The first conductive plugs 762 may be provided at the lower ends of the channels CH and the cell contact plugs 760. The bit lines 765 and 765a may be provided between the first and second conductive plugs 762 and 764 at the lower ends of the first conductive plugs 762. The bit lines 765 and 765a may include bit lines 765 connected to the channels CH, and bit lines 765a connected to the cell contact plugs 760. The bit lines 765a connected to the cell contact plugs 760 may be wiring lines that are formed at the same level in the same process step as the bit lines 765 connected to the channels CH. Although the bit lines 765a connected to the cell contact plugs 760 are shown below all the first conductive plugs 762, example embodiments are not limited thereto. The second conductive plugs 764 may be provided below the bit lines 765 and 765a and may be connected to the second bonding metal layer 522b of the second bonding layer 522.

The second bonding metal layer 522b may include a second metal layer 522b_2 and a second adhesive layer 522b_1. According to some example embodiments, the contents relating to the second bonding structure 520 described using FIGS. 1 to 5 may be similarly applied to FIGS. 6 and 7.

Referring to FIGS. 4 and 7 together, the first and second bonding layers 512 and 522 may include the first and second metal layers 512b_2 and 522b_2, and first and second adhesive layers 512b_1 and 522b_1 provided on the first and second metal layers 512b_2 and 522b_2. Further, the materials of the first and second adhesive layers 512b_1 and 522b_1 may be different from the materials of the first and second metal layers 512b_2 and 522b_2.

The first and second bonding layers 512 and 522 may include first and second bonding insulation layers 512a and 522a adjacent to the first and second metal layers 512b_2 and 522b_2, between the first and second substrate structures 511 and 521. The first and second bonding insulation layers 512a and 522a may include a dielectric material, and the first and second metal layers 512b_2 and 522b_2 may include copper (Cu).

The first and second bonding layers 512 and 522 may include the first and second adhesive layers 512b_1 and 522b_1, which have an absorptivity in a specific wavelength band higher than the first and second metal layers 512b_2 and 522b_2. For example, the specific wavelength band may be a range of 1,000 to 1,100 nm. The first and second adhesive layers 512b_1 and 522b_1 may include at least one of Ti, V or Mo.

That is, the heat absorptivity of the first and second metal layers 512b_2 and 522b_2 may be increased through the first and second adhesive layers 512b_1 and 522b_1 to effectively form the Cu—Cu bond. As a result, because heat may be locally applied to the bonding region, it is possible to prevent unwanted characteristic deterioration from occurring in other regions of the semiconductor device other than the bonding region.

Figure 8:
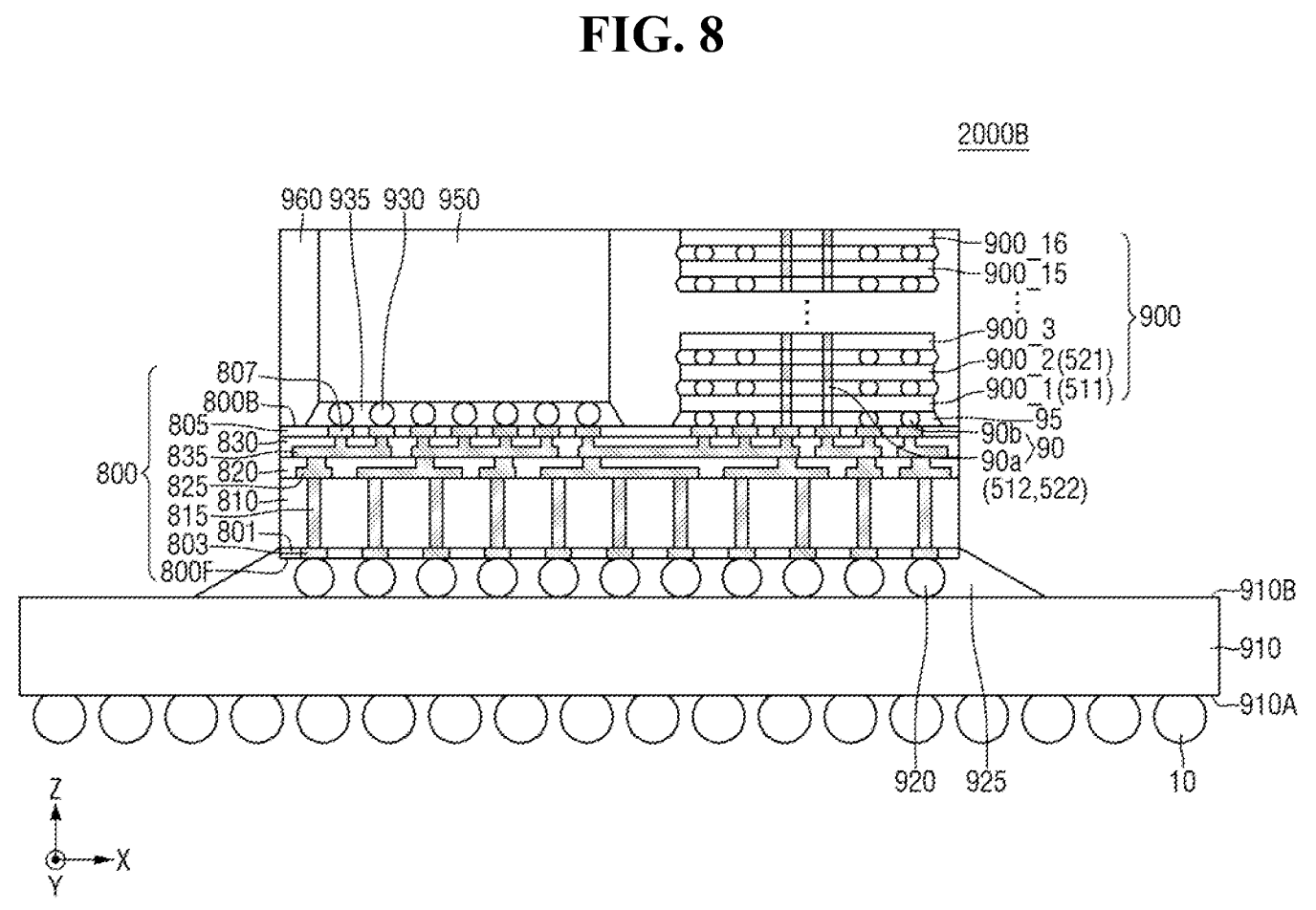

FIG. 8 is a diagram which shows the semiconductor device manufactured by the apparatus for manufacturing the semiconductor device according to some example embodiments.

Referring to FIG. 8, a semiconductor device 2000B may include a substrate 910, an external connection terminal 10, a first underfill material 925, an internal connection terminal 920, an interposer layer 800, a first semiconductor chip 950, a second semiconductor chip 900, and a molding layer 960.

The substrate 910 may include a first side 910A and a second side 910B that are opposite to each other. The first side 910A of the substrate 910 may be a lower side of the substrate 910 on the basis of the third direction Z, and the second side 910B of the substrate 910 may be an upper side of the substrate 910 on the basis of the third direction Z.

The substrate 910 may be a package substrate, for example, a printed circuit board (PCB), a ceramic substrate, or the like. When the substrate 910 is a printed circuit board, the substrate 910 may be formed of at least one material selected from phenolic resin, epoxy resin, and polyimide. For example, the substrate 910 may include at least one material selected from FR4, tetrafunctional epoxy, polyphenylene ether, epoxy/polyphenylene oxide, bismaleimide triazine (BT), thermount, cyanate ester, polyimide, and liquid crystal polymer. The surface of the substrate 910 may be covered with a solder resist, but example embodiments are not limited thereto.

The external connection terminal 10 may be provided on the first side 910A of the substrate 910. The external connection terminal 10 may protrude from the first side 910A of the substrate 910. The external connection terminal 10 may electrically connect the semiconductor device to the external device. The external connection terminal 10 may be, for example, a BGA (Ball Grid Array).

The internal connection terminal 920 may be provided on the second side 910B of the substrate 910. The internal connection terminal 920 may be provided between the substrate 910 and the interposer layer 800. The internal connection terminal 920 may protrude from the second side 910B of the substrate 910.

The external connection terminal 10 and the internal connection terminal 920 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, but example embodiments are not limited thereto.

The first underfill material 925 may be provided between the substrate 910 and the interposer layer 800. The first underfill material 925 may be provided between the second side 910B of the substrate 910 and the first side 800F of the interposer layer 800. The first underfill material 925 may wrap and protect the internal connection terminal 920. The first underfill material 925 may include, for example, an epoxy-based resin or polyimide.

The interposer layer 800 may include a first side 800F and a second side 800B that are opposite to each other. The first side 800F of the interposer layer 800 may be a lower side of the interposer layer 800 on the basis of the third direction Z, and the second side 800B of the interposer layer 800 may be an upper side of the interposer layer 800 on the basis of the third direction Z.

The interposer layer 800 may include a first passivation layer 801, a second passivation layer 805, a substrate layer 810, a first layer 820, and a second layer 830.

The first passivation layer 801 may include a first connection pad 803. At least a part of the first connection pad 803 may be exposed through the first passivation layer 801. The first connection pad 803 may include a conductive material, and may be electrically connected to one or more internal connection terminals 920. Therefore, the interposer layer 800 may be bonded and electrically connected to the substrate 910 through the internal connection terminal 920. The first passivation layer 801 may include, for example, but is not limited to, an oxide film or a nitride film.

The second passivation layer 805 may include a second connection pad 807. At least a part of the second connection pad 807 may be exposed through the second passivation layer 805. The second connection pad 807 may include a conductive material, and may be electrically connected to one or more first bumps 930 and second bumps 90. Therefore, the interposer layer 800 may be bonded and electrically connected to the first semiconductor chip 950 and the second semiconductor chip 900 through the first bump 930 and the second bump 90. The first and second passivation layers 801 and 805 may include, for example, but are not limited to, an oxide film or a nitride film.

The substrate layer 810 may be provided on the first passivation layer 801. The substrate layer 810 may include, for example, silicon (Si). The substrate layer 810 may include a first through via 815. The first through via 815 may penetrate the substrate layer 810.

The first layer 820 may be formed of an insulating material and may be placed on the substrate layer 810. The first wiring 825 may be formed of a conductive material and may be provided in the first layer 820. The first wiring 825 may be provided on the first through via 815 and may be electrically connected to the first through via 815. The second layer 830 may be formed of an insulating material and may be provided between the first layer 820 and the second passivation layer 805. The second wiring 835 may be formed of a conductive material and may be provided in the second layer 830. The second wiring 835 may be electrically connected to the first wiring 825 and the second connection pad 807.

The first semiconductor chip 950 and the second semiconductor chip 900 may be provided on the second side 800B of the interposer layer 800. The first semiconductor chip 950 and the second semiconductor chip 900 may be spaced apart from each other along the first direction X and not overlap each other in a plane. Although FIG. 8 shows two types of first semiconductor chips 950 and second semiconductor chips 900, example embodiments are not limited thereto, and the number and types of semiconductor chips may vary. The plurality of semiconductor chips 950 and 900 may be electrically connected to the substrate 910 through the interposer layer 800.

The first semiconductor chip 950 may be, for example, a logic chip. For example, the logic chip may be a Central Processor Unit (CPU), Micro Processor Unit (MPU), Graphic Processor Unit (GPU), controller, an application specific integrated circuit (ASIC), a modem chip, or the like. Alternatively, the first semiconductor chip 950 may be an Application Processor (AP) used for a mobile phone or a smartphone.

The first bump 930 may be provided on the upper side of the first semiconductor chip 950. The first bump 930 may be provided on the interposer layer 800 and may be electrically connected to the second connection pad 807. A second underfill material 935 may be provided between the first semiconductor chip 950 and the interposer layer 800. The second underfill material 935 may be provided between the second side 800B of the interposer layer 800 and the first semiconductor chip 950. The above-mentioned description regarding the first underfill material 925 may be similarly applied to the functions and materials of the second underfill material 935.

The second semiconductor chip 900 may be a memory chip of a different type from the first semiconductor chip 950. The second semiconductor chip 900 may be, for example, a semiconductor memory chip. For example, the semiconductor memory chip may be a volatile memory chip such as a Dynamic Random Access Memory (DRAM) or an Static Random Access Memory (SRAM), or non-volatile memory chip such as a Phase-change Random Access Memory (PRAM), a Magnetoresistive Random Access Memory (MRAM), a Ferroelectric Random Access Memory (FeRAM) or a Resistive Random Access Memory (RRAM). Further, the memory chip may be a High Bandwidth Memory (HBM) semiconductor memory chip in which a plurality of DRAM memory chips are stacked. For example, the second semiconductor chip 900 may be an HBM semiconductor memory chip.

The second semiconductor chip 900 may include second semiconductor chips 900_1 to 900_16, and may be sequentially stacked in the third direction Z on the interposer layer 800. As an example, second semiconductor chips 900_2 to 900_16 may be stacked HBM semiconductor memory chips, the second semiconductor chip 900_1 provided below them may be a memory controller, and the second semiconductor chip 900 may be a Hybrid Memory Cube (HMC) memory chip.

The second bump 90 includes a second bump 90a, and a second bump 40b spaced apart from the second bump 90a. A Through Silicon Via (TSV) structure electrically connected to the second bump 90a may be provided below the second bump 90a. However, example embodiments are not limited thereto.

A third underfill material 95 may be provided between the second side 800B of the interposer layer 800 and the second semiconductor chip 900, or between the second semiconductor chips 900. The third underfill material 95 may wrap the second bump 90. The third underfill material 95 may protect the second bump 90. The specific material description of the third underfill material 95 may be replaced with the description of the first underfill material 925 described above.

In some example embodiments, the first and second substrate structures 511 and 521 of FIGS. 1 to 5 may correspond to the second semiconductor chips 900_1 and 900_2 of FIG. 8, and the first and second bonding layers 512 and 522 of FIGS. 1 to 5 may correspond to the second bump 90a of FIG. 8. Therefore, the semiconductor device 2000B may include the first substrate structure 511 and the second substrate structure 521 bonded through the first and second bonding layers 512 and 522.

On the other hand, the first bonding layer 512 may include the first bonding metal layer 512b. The first bonding metal layer 512b may include a first metal layer 512b_2 and a first adhesive layer 512b_1. According to some example embodiments, the contents of the first bonding structure 510 described using FIGS. 1 to 5 may also be similarly applied to FIG. 8.

Further, the second bonding layer 522 may include the second bonding metal layer 522b. The second bonding metal layer 522b may include a second metal layer 522b_2 and a second adhesive layer 522b_1. According to some example embodiments, the contents of the second bonding structure 520 described using FIGS. 1 to 5 may also be similarly applied to FIG. 8.

Referring to FIGS. 4 and 8 together, the first and second bonding layers 512 and 522 may include first and second metal layers 512b_2 and 522b_2, and first and second adhesive layers 512b_1 and 522b_1 provided on the first and second metal layers 512b_2 and 522b_2. Further, the materials of the first and second adhesive layers 512b_1 and 522b_1 may be different from the materials of the first and second metal layers 512b_2 and 522b_2.

The first and second bonding layers 512 and 522 may include the first and second bonding insulation layers 512a and 522a that are adjacent to the first and second metal layers 512b_2 and 522b_2, between the first and second substrate structures 511 and 521. The first and second bonding insulation layers 512a and 522a may include a dielectric material, and the first and second metal layers 512b_2 and 522b_2 may include copper (Cu).

The first and second bonding layers 512 and 522 may include the first and second adhesive layers 512b_1 and 522b_1, which have an absorptivity in a specific wavelength band higher than the first and second metal layers 512b_2 and 522b_2. For example, the specific wavelength band may be a range of 1,000 to 1,100 nm. The first and second adhesive layers 512b_1 and 522b_1 may include at least one of Ti, V or Mo.

That is, the heat absorptivity of the first and second metal layers 512b_2 and 522b_2 may be increased through the first and second adhesive layers 512b_1 and 522b_1 to effectively form the Cu—Cu bond. As a result, because heat may be locally applied to the bonding region, it is possible to prevent unwanted characteristic deterioration from occurring in other regions of the semiconductor device other than the bonding region.

FIGS. 9A, 9B, 9C, 9D and 9E are diagrams illustrating intermediate stages of manufacturing a semiconductor device according to some example embodiments. For convenience of explanation, repeated parts of the contents described using FIGS. 1 to 5 will not be described or briefly described.

Figure 9A:
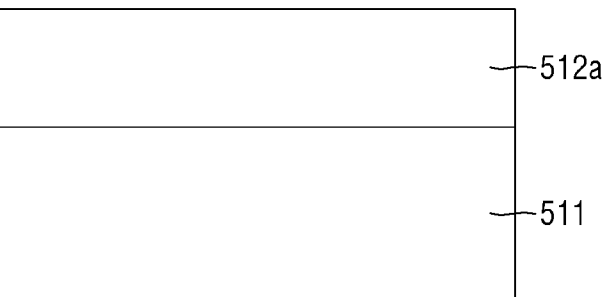
FIGS. 9A, 9B, 9C, 9D and 9E are diagrams illustrating intermediate stages of manufacturing a semiconductor device according to some example embodiments.

Referring to FIG. 9A, the first bonding insulation layer 512a may be formed on the first substrate structure 511. For example, the first substrate structure 511 may include silicon, and the first bonding insulation layer 512a may include silicon oxide.

Figure 9B:
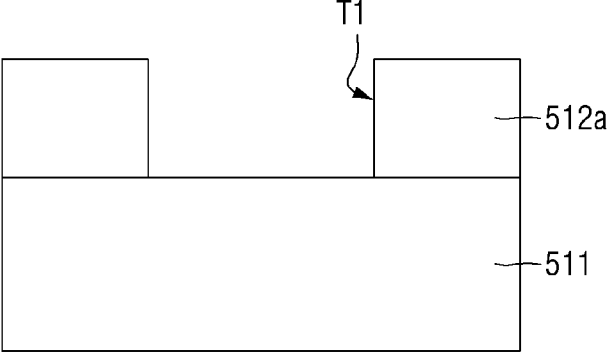

Referring to FIG. 9B, a part of the first bonding insulation layer 512a may be removed to form a first trench T1. A part of the first bonding insulation layer 512a may be removed, using an etching process. A part of the first bonding insulation layer 512a may be removed to expose a part of the side wall of the first bonding insulation layer 512a and a part of the first substrate structure 511.

Figure 9C:
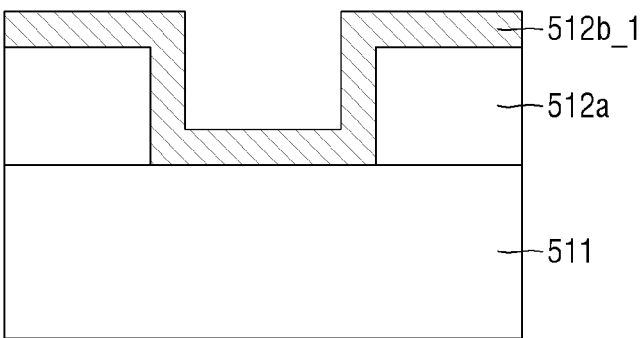

Referring to FIG. 9C, the first adhesive layer 512b_1 may be formed along the bottom surface and the side wall of the first trench T1. The first adhesive layer 512b_1 may be formed along the side wall of the exposed first bonding insulation layer 512a and the surface of first substrate structure 511. The first adhesive layer 512b_1 may be formed, for example, by a sputtering process. The first adhesive layer 512b_1 may include at least one of Ti, V or Mo.

Figure 9D:
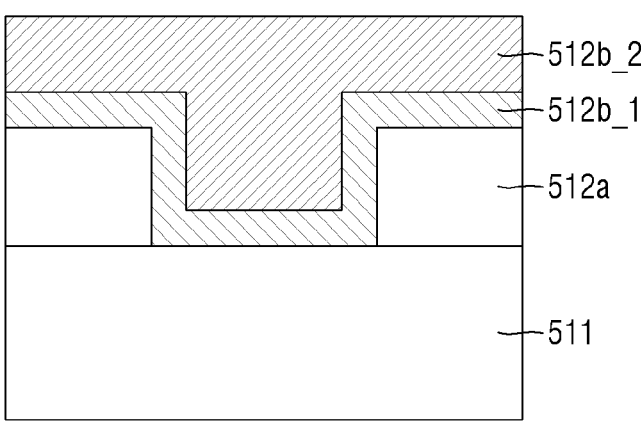

Referring to FIG. 9D, the first metal layer 512b_2 may be formed on the first adhesive layer 512b_1 to form the first bonding metal layer 512b. For example, after a seed layer is formed on the first adhesive layer 512b_1, the first metal layer 512*b*_2 may be formed on the seed layer. The first metal layer 512*b*_2 may be formed, using electroplating. The seed layer and the first metal layer 512*b*_2 may include copper.

Figure 9E:
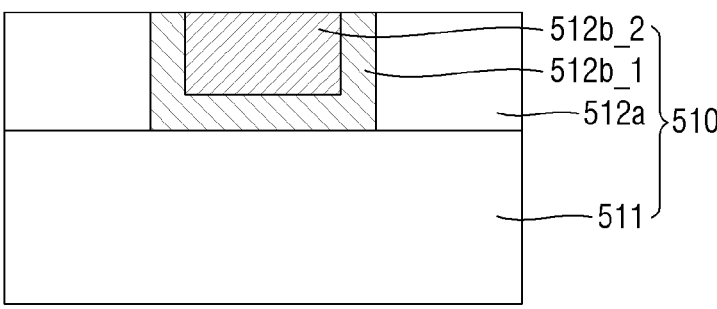

Referring to FIG. 9E, the upper sides of the first adhesive layer 512*b*_1 and the first metal layer 512*b*_2 may be flattened to obtain the first bonding structure 510. This may be performed by removing a part of the upper parts of the first adhesive layer 512*b*_1 and the first metal layer 512*b*_2, using a chemical or physical method.

Thereafter, a second bonding insulation layer may be formed on the second substrate structure, a part of the second bonding insulation layer may be removed to form a second trench, a second adhesive layer may be formed along a bottom surface and side walls of the second trench, and a second metal layer may be formed on the second adhesive layer to form a second bonding metal layer 522*b*. The contents described using FIGS. 9A, 9B, 9C, 9D and 9E may be similarly applied thereto to obtain the second bonding structure 520. The first bonding structure 510 and the second bonding structure 520 may then be positioned with respect to each other so that the first and second metal layers 512*b*_2 and 522*b*_2 face each other.

After that, a laser may be irradiated so that laser beam reaches the first and second adhesive layers 512*b*_1 and 522*b*_1, and the first and second metal layers 512*b*_2 and 522*b*_2 to bond the first and second metal layers 512*b* and 522*b* to each other. The first and second metal layers 512*b*_2 and 522*b*_2 may be heated by a laser beam to form the Cu—Cu bond by diffusion of Cu and growth of grains.

The first and second adhesive layers 512*b*_1 and 522*b*_1 may have an absorptivity within a wavelength in the range of 1,000 to 1,100 nm higher than the first and second metal layers 512*b*_2 and 522*b*_2. That is, the first and second adhesive layers 512*b*_1 and 522*b*_1 may be formed to promote the Cu diffusion and grain growth of the first and second metal layers 512*b*_2 and 522*b*_2 whose absorptivity in the range of 1,000 to 1,100 nm is lower than those of the first and second adhesive layers 512*b*_1 and 522*b*_1. That is, by causing the laser beam to heat the first and second metal layers 512*b*_2 and 522*b*_2 via the first and second adhesive layers 512*b*_1 and 522*b*_1, it is possible to prevent characteristic deterioration of the semiconductor device and form the Cu—Cu bond.

While aspects of example embodiments have been particularly shown and described, it will be understood that various changes in form and details may be made therein without departing from the spirit and scope of the following claims.

What is claimed is:

1. A method for manufacturing a semiconductor device which uses an apparatus for manufacturing the semiconductor device including a chamber, a support structure provided inside the chamber, and configured to support a bonding structure that includes a first substrate structure, a second substrate structure, and a bonding metal layer provided between the first substrate structure and the second substrate structure, and a laser device which is provided above the chamber, the method for manufacturing the semiconductor device comprising:

irradiating a laser beam to the bonding structure through the first substrate structure using the laser device, wherein the bonding metal layer includes a first metal layer, and an adhesive layer provided on the first metal layer, wherein the first metal layer and the adhesive layer includes different materials from each other, and wherein the laser beam passes through the first substrate structure and the second substrate structure to reach the bonding metal layer.

2. The method for manufacturing a semiconductor device of claim 1, wherein the adhesive layer includes a metal material having a higher absorptivity of the laser beam in a first wavelength band than the first metal layer, and the laser beam is irradiated to the first metal layer via the adhesive layer.

3. The method for manufacturing a semiconductor device of claim 2, wherein the first wavelength band is between 1,000 and 1,100 nm.

4. The method for manufacturing a semiconductor device of claim 2, wherein the adhesive layer includes any one or any combination of Ti, V or Mo.

5. The method for manufacturing a semiconductor device of claim 1, wherein the apparatus for manufacturing the semiconductor device further includes a heat exchanger configured to:

transfer heat generated by the laser beam from the bonding structure.

6. The method for manufacturing a semiconductor device of claim 5, wherein the heat exchanger is provided on a chuck inside the support structure.

7. The method for manufacturing a semiconductor device of claim 1, wherein an upper wall of the chamber includes a transparent material, and the irradiating the laser beam comprises irradiating the laser beam the bonding structure through the upper wall of the chamber.

8. A method for manufacturing a semiconductor device, comprising:

providing a bonding structure on a support structure, wherein the bonding structure includes a first substrate structure, a second substrate structure, and a bonding metal layer between the first substrate structure and the second substrate structure; and irradiating a laser beam to the bonding structure through the first substrate structure, wherein the laser beam passes through the first substrate structure and the second substrate structure to reach the bonding metal layer.

9. The method for manufacturing the semiconductor device of claim 8, wherein the bonding metal layer includes a first metal layer, and an adhesive layer having a higher absorptivity of the laser beam in a first wavelength band than the first metal layer, and the laser beam is irradiated to the first metal layer via the adhesive layer.

10. The method for manufacturing the semiconductor device of claim 9, wherein the first wavelength band is between 1,000 and 1,100 nm.

11. The method for manufacturing the semiconductor device of claim 9, wherein the adhesive layer includes any one or any combination of Ti, V or Mo.

12. The method for manufacturing the semiconductor device of claim 8, wherein the irradiating the laser beam comprises irradiating the laser beam the bonding structure through an upper wall of a chamber, and the support structure is provided in the chamber.

13. The method for manufacturing the semiconductor device of claim 8, further comprising controlling a heat exchanger to remove heat generated by the laser beam from the bonding structure.

14. A method for manufacturing a semiconductor device, comprising:

forming a first bonding insulation layer on a first substrate structure;

removing a part of the first bonding insulation layer to form a first trench;

forming a first adhesive layer along a bottom surface and side walls of the first trench;

forming a first metal layer on the first adhesive layer to form a first bonding metal layer, the first metal layer including a metal material different from the first adhesive layer;

forming a second bonding insulation layer on a second substrate structure;

removing a part of the second bonding insulation layer to form a second trench;

forming a second adhesive layer along a bottom surface and side walls of the second trench;

forming a second metal layer on the second adhesive layer to form a second bonding metal layer, the second metal layer including a metal material different from the second adhesive layer;

providing the second substrate structure on the first substrate structure; and irradiating a laser beam to the first substrate structure and the second substrate structure to bond the first metal layer with the second metal layer.

15. The method for manufacturing the semiconductor device of claim 14, wherein the first adhesive layer and the second adhesive layer have an absorptivity of the laser beam that is higher than the first metal layer and the second metal layer in a wavelength band between 1,000 and 1,100 nm, and the irradiating comprises irradiating the first metal layer and the second metal layer with the laser beam via the first adhesive layer and the second adhesive layer.

16. The method for manufacturing the semiconductor device of claim 14, wherein the first adhesive layer and the second adhesive layer each include any one on any combination of Ti, V or Mo.

17. The method for manufacturing the semiconductor device of claim 14, further comprising controlling a laser to move to a first position corresponding to the first substrate structure and the second substrate structure.

18. The method for manufacturing the semiconductor device of claim 17, further comprising controlling the laser to move to a second position corresponding to a different substrate structure.

* * * * *